United States Patent
Hsu et al.

(10) Patent No.: US 10,909,297 B1
(45) Date of Patent: Feb. 2, 2021

(54) DETERMINISTIC SYSTEM FOR DEVICE LAYOUT OPTIMIZATION

(71) Applicant: Taiwan Semiconductor Manufacturing Company Limited, Hsinchu (TW)

(72) Inventors: Chin-Chang Hsu, New Taipei (TW); Rachid Salik, Sunnyvale, CA (US); Chien-Te Wu, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/677,871

(22) Filed: Nov. 8, 2019

Related U.S. Application Data (60) Provisional application No. 62/887,008, filed on Aug. 15, 2019.

(51) Int. Cl.
  *G06F 30/39* (2020.01)
  *G06F 30/392* (2020.01)
  *G06F 30/398* (2020.01)

(52) U.S. Cl.
  CPC .......... *G06F 30/392* (2020.01); *G06F 30/398* (2020.01)

(58) Field of Classification Search
  CPC .............................. G06F 30/398; G06F 30/392
  USPC ........................................ 716/112, 135, 139
  See application file for complete search history.

(56) References Cited

U.S. PATENT DOCUMENTS

| | | | | |
|---|---|---|---|---|
| 7,386,821 B2* | 6/2008 | Higman et al. | ........ | G06F 30/392 716/122 |
| 8,448,097 B2* | 5/2013 | Dai et al. | .............. | G06F 30/398 716/52 |
| 8,453,103 B2* | 5/2013 | Bendicksen et al. | ... | G06F 30/00 716/139 |
| 9,841,370 B2* | 12/2017 | Amir | ................... | G03F 7/70616 |
| 9,977,854 B2* | 5/2018 | Rowhani et al. | ...... | G06F 30/394 |
| 10,216,890 B2* | 2/2019 | Qian | ......................... | G03F 1/70 |
| 10,331,842 B2* | 6/2019 | Alloatti | ................. | G06F 30/398 |
| 10,503,865 B2* | 12/2019 | Alloatti | ................. | G06F 30/392 |
| 10,628,549 B2* | 4/2020 | Berkens | ............... | G06F 11/3684 |
| 2018/0181699 A1* | 6/2018 | Qian | ....................... | G06F 30/39 |

* cited by examiner

Primary Examiner — Sun J Lin
(74) Attorney, Agent, or Firm — Jones Day (57) ABSTRACT

Systems, methods, and devices are described herein for a deterministic approach that includes receiving an original layout of a semiconductor device that has a number of layers. A violation of a first design rule associated with a first layer of the number of layers is identified. A design rule compilation includes a plurality of design rules associated with each layer of the number of layers. A plurality of derived layers are generated based upon the plurality of design rules. Each derived layer of the plurality of derived layers includes one or more layers of the number of layers of the semiconductor device in which a physical movement to one layer impacts another layer. A forbidden region associated with a second layer of the plurality of layers is designated. A new layout of the number of layers having oriented differently than the original layout is generated such that no layer protrudes within the forbidden region.

20 Claims, 12 Drawing Sheets

DETERMINISTIC SYSTEM FOR DEVICE LAYOUT OPTIMIZATION

PRIORITY CLAIM

The present application claims priority to U.S. Application No. 62/887,008, filed Aug. 15, 2019, the contents of which is incorporated by reference herein in its entirety.

FIELD

The technology described in this disclosure relates generally to electronic systems and more particularly integrated device layout optimization using a deterministic system.

BACKGROUND

Integrated circuits (ICs) are manufactured using a number of machines and/or automated manufacturing processes. IC layouts define the design of the IC. At times, a designed IC may not comply with the design requirements. Checking or validating that the designed IC layout complies with design requirements can help avoid manufacturing and/or operational issues. The more intricate of a design, the more difficult it becomes to validate the designed IC layout. Additionally, fixing one design rule violation may induce one or more different violations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An electronic device layout design, such as an IC layout design, must comply with a number of design rules in order to ensure the design can be manufactured in accordance with its corresponding design. A design rule check (DRC) deck is used to verify IC layout designs. If a layout design is found to be in violation of any rules within the DRC deck, the layout design is modified accordingly to correct such violation.

Analyzing and fixing device layout designs using a heuristic method is an iterative process that can be time consuming and wrought with human error. Using a heuristic approach, a device layout is analyzed in view of a number of design requirements. Design rule requirements can be defined by design rule manual (DRM) translated into the DRC deck or programming code. Any violation of the requirements with the DRC deck is identified and manually corrected by a layout engineer through moving one or more components of the circuit. Identifying and correction of design rule violations using such an approach can require a number of iterations. Correction of one violation can also lead to a new violation as a result of modifying placement of components within the circuit.

A deterministic approach as described herein includes receiving an original layout of a semiconductor device that has a number of layers. In some cases, there may be one or more design rule violations with the layout. Using a deterministic approach, an extractor program can perform design rule requirement tracing, using the DRC deck, to identify layers of the circuit that are related to each other and generate a layer and rule relation tree. The layer and rule relation tree includes a number of derived layers, each of which identified related layers of the circuit. Each of the derived layers are designated as being modifiable or fastened. Modifiable layers can be moved in order to correct the violation whereas fastened layers are not moved to correct the violation. A forbidden region is designated associated with the fastened layers in order to prevent additional rule violations. The modifiable layers are moved accordingly within the layout to correct the violation, while ensuring that no layer encroaches upon the forbidden region. The new layout generated by moving the modifiable layers corrects any violations of the original layout and ensures no further violations occur with the new layout.

Figure 1:
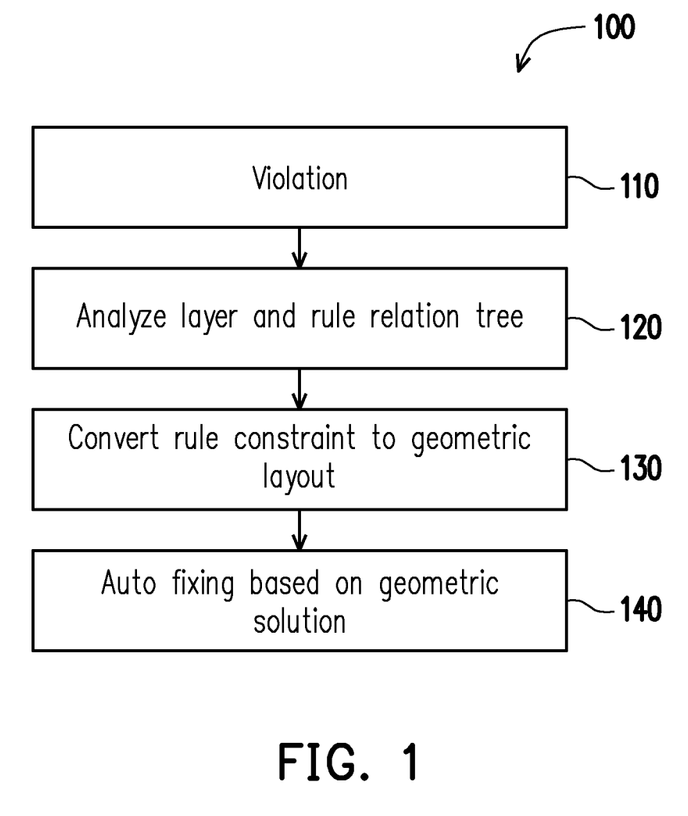
FIG. 1 illustrates an exemplary process flow diagram of a deterministic method for fixing a rule violation in accordance with various embodiments of the present disclosure.

FIG. 1 illustrates an exemplary process flow diagram 100 of a deterministic method for fixing a rule violation in accordance with various embodiments of the present disclosure. A device layout is a two-dimensional geometric representation of a physical device. The device layout includes a number of polygons are represented using any applicable IC standard format such as graphic database system (GDS) or open artwork system interchange standard (OASIS) formats. Exemplary device layouts are illustrated and explained in FIG. 2A-2B. The device layout is analyzed against the DRC deck at the cell level to identify whether any rule violations exist, at 110. The cell level is the top level in hierarchic design. A violation exists when a device layout design does not comply with one or more rules in the DRC deck. In other words, a DRC error flag is triggered for a particular device layout.

With one or more violations identified, a deterministic model analyzes the various drawing layers impacted by the violation and a layer and rule relation tree, at 120. All rules relating to any impacted layer of the device are considered for fixing. This includes any rule relating to a layer that could be impacted by the physical movement of another layer. A layer and rule relation tree is extracted, as described in more detail in FIGS. 3-4. The layer and rule relation tree extracts various rule and layer dependencies by tracing rules within existing an existing DRM or DRC deck. The extracted layer and rule relation tree is converted into a geometric layout, at 130, as described in more detail in FIG. 5, having forbidden zones that define areas in which device elements cannot be moved. The violation is then automatically fixed based on a geometric solution, at 140, by adjustment of polygons within the layout to satisfy design rule and avoid additional rule violations.

Figure 2A:
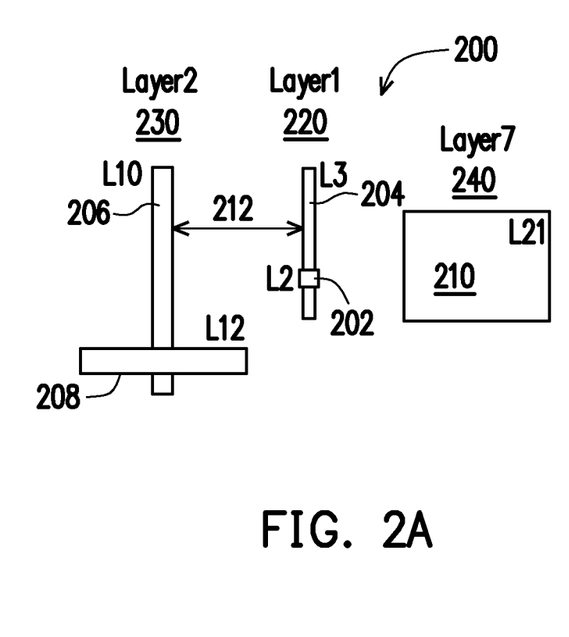
FIG. 2A illustrates an exemplary device layout having a violation in accordance with various embodiments of the present disclosure.

FIG. 2A illustrates an exemplary device layout 200 having a violation in accordance with various embodiments of the present disclosure. Device layout 200 includes a number of drawing layers (e.g., L2 202, L3 204, L10 206, L12 208, and L21 210) that represent elements of a device. In this example, a horizontal distance 212 between layer L3 204 and layer L10 206 violates a design rule (e.g., rule #10) within a DRM or DRC deck associated with the device (e.g., layer L3 204 and L10 206 require a larger distance between each other). In order fix the violation, a number of derived layers are generated that define include one or more of the drawing layers in which physical movement to one drawing layer impacts another drawing layer. For example, within device layout 200, movement of layer L3 204 impacts layer L2 202. Physical movement of layer L3 204 could result in, for example, no overlap between layer L2 202 and layer L3 204. A derived layer Layer1 220 is defined which includes both layers L2 202 and layer L3. A derived layer Layer2 230 is defined to be the logic operation (LOP) of drawing layer L10 206. Another derived layer Layer7 240 is defined to include drawing layer L21 210 and drawing layer L18 (not shown). The identification of related drawing layers and definition of derived layers is described in more detail in FIGS. 3-5. Layers of the device layout 200 are designated as either a fastened layer that cannot be physically moved without causing a violation or a modifiable layer that can be moved without causing a violation. In other words, a fastened layer remains physically unmodified within layout 200 and a modifiable layer can be subjected to modification within the layout 200. The designations are determined based on a layer relation tree that is extracted from the device layout, the details of which are described in FIGS. 3-5.

Figure 2B:
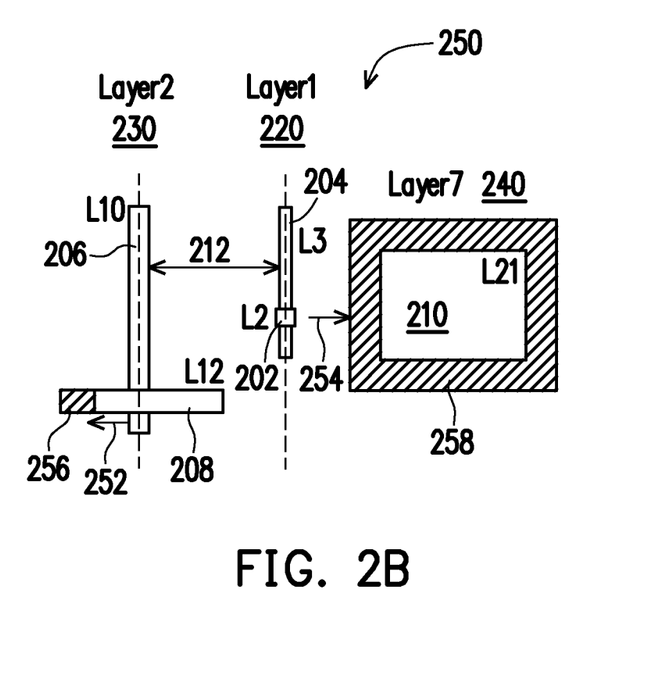
FIG. 2B illustrates an exemplary device layout having fixing hints that show how the various layers of device layout can be adjusted to fix a in accordance with various embodiments of the present disclosure.

FIG. 2B illustrates an exemplary device layout 250 having fixing hints 252 and 254 that show how the various layers of device layout 200 can be adjusted to fix the violation of rule #10 without inducing additional violations in accordance with various embodiments of the present disclosure. By way of example, based on the analyzing of design rules from the DRM or DRC deck and the layer relation tree, any layers associated with the rule violation are designated as modifiable layers that are candidates to move within the layout to fix the violation (e.g., drawing layer L3 204, drawing layer L2 202, and drawing layer L10 206). All other relative layers are designated as fastened layers that are not candidates for moving (e.g., drawing layer L12 208 and drawing layer L21 210). Fixing hint 252 provides an indication that the violation of rule #10 can be fixed, either partially or completely, by moving drawing layer L10 206 in a horizontal direction to increase the horizontal distance 212 between layer L10 206 and layer L3 204. The movement of layer L10 206 is bounded, however, by forbidden region 256 associated with layer L12 208. Layer L10 206 can be moved up to a boundary of forbidden region 256 but cannot be moved to a position within forbidden region 256. Fixing hint 254 provides an indication that the violation of rule #10 can also be fixed, either partially or completely, by moving derived layer Layer1 220 in a horizontal direction to increase the horizontal distance 212 between layer L10 206 and layer L3 204. The movement of derived layer Layer1 220 is bounded, however, by forbidden region 258 associated with layer L21 210. Derived layer Layer1 220 can be moved up to a boundary of forbidden region 258 but cannot be moved to a position within forbidden region 258. Based on the fixing hints 252 and 254, a new layout can be generated having either layer L10 206 or derived layer Layer1 220 or a combination of both oriented differently with layout 200 such that there is no longer a violation of rule #10 or any other rule violation. Within the new layer, no layer protrudes within a forbidden region. Possible solutions for fixing the rule #10 violation illustrated in layouts 200, 250 are described in FIGS. 6A-6C.

Figure 3:
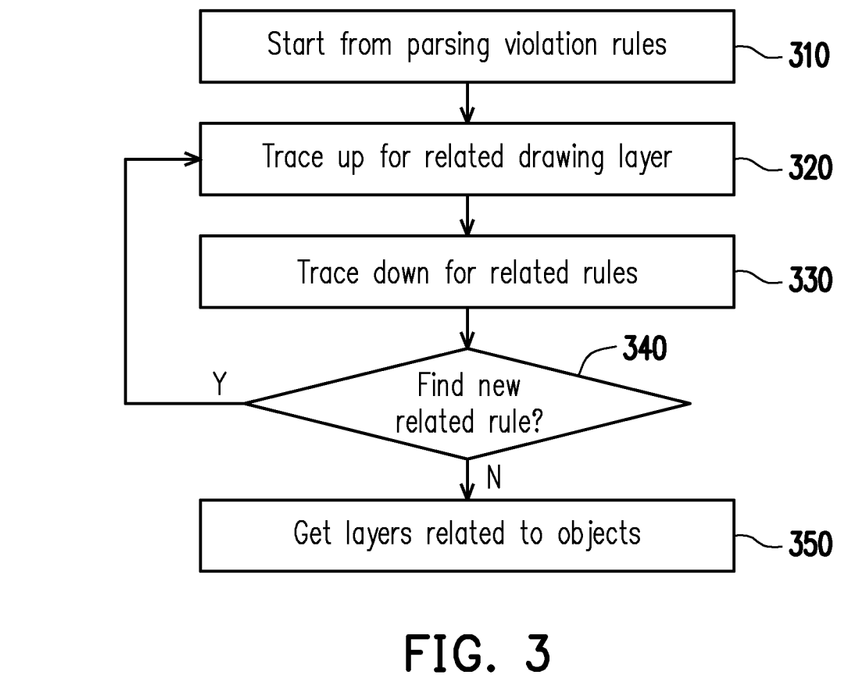
FIG. 3 illustrates an exemplary extraction method for extracting a layer and rule relation tree from either a DRM or DRC deck in accordance with various embodiments of the present disclosure.

FIG. 3 illustrates an exemplary extraction method 300 for extracting a layer and rule relation tree from either a DRM or DRC deck in accordance with various embodiments of the present disclosure. The rules associated with the violation are decomposed and constraints from corresponding layer are identified. Extraction method 300 is a reverse trace from a violated rule to the drawing layers impacted (e.g., the violation of rule #10 impacted drawing layer L3 204 and drawing layer L10 206). In other words, violation rules are parsed, at 310. A top-down trace of the rules associated with those layers. For example, a trace for related drawing layers is performed, at 320. Such a trace would, for example, identify drawing layer L2 202 as being a drawing layer related to drawing layer L3 204. Additional trace is performed, at 330, to determine if any other design rules are related to the impacted drawing layers. This process is iteratively repeated until all related rules within either the DRM or DRC deck are identified. After the extraction of the related rules, any additional drawing layers impacted by the violated rule are identified, at 350.

Figure 4:
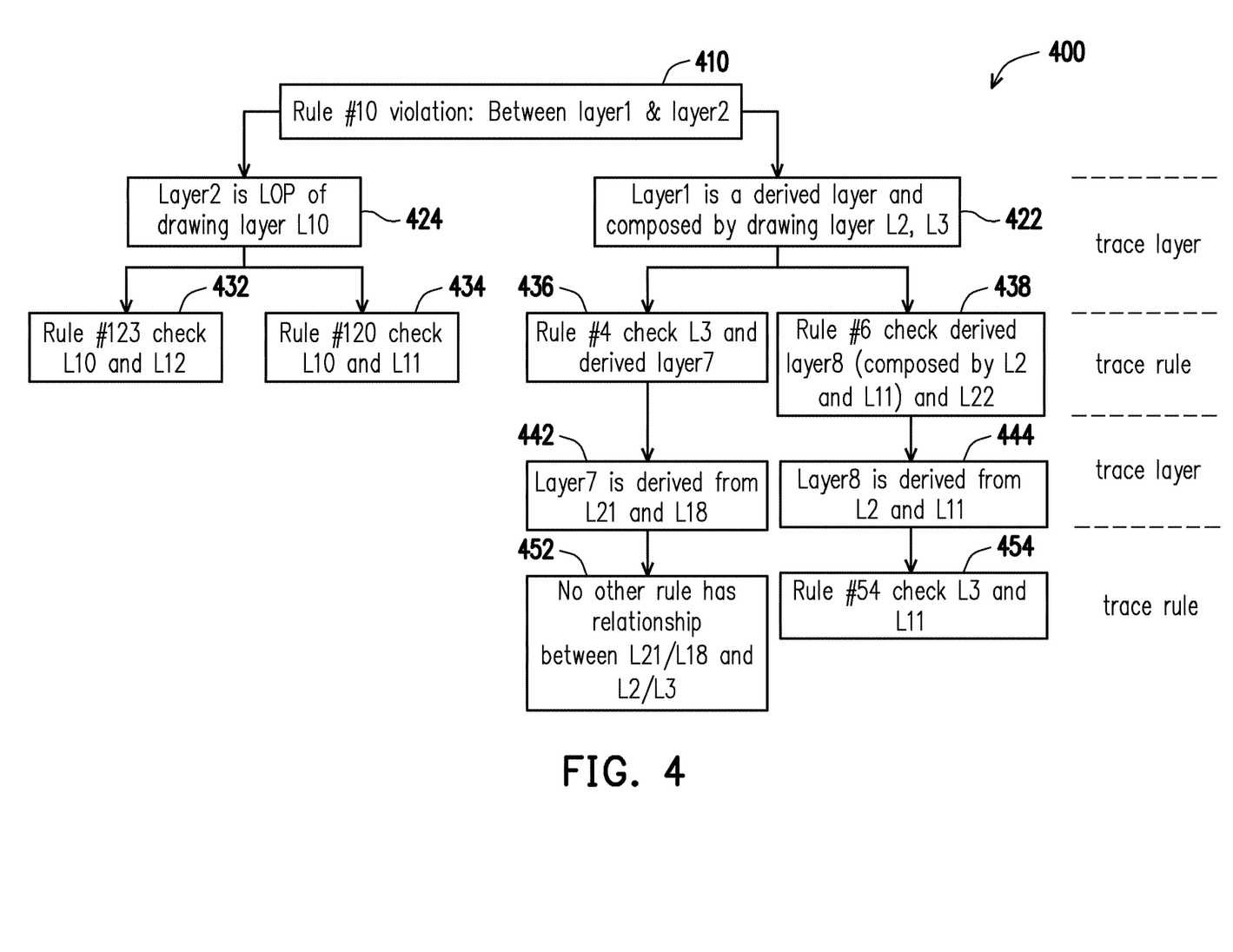
FIG. 4 illustrates an exemplary extracted layer relation tree in accordance with various embodiments of the present disclosure.

FIG. 4 illustrates an exemplary extracted layer relation tree 400 in accordance with various embodiments of the present disclosure. The violation of rule #10 is identified, at 410, and traced to impact derived layer layer1 220, at 422, and derived layer Layer2 230, at 424. Related rules are then traced for both impacted layers derived layer Layer1 220, at 432 and 434, and derived layer Layer2 230, at 436 and 438. For example, derived layer Layer2 230 is also related to rule #123 that impacts drawing layer L12 208 and rule #120 that impacts drawing layer L11 (not shown in FIGS. 2A-2B). Derived layer Layer1 220 is related to rule #4 that impacts drawing layer L3 204 and derived layer Layer7 240. Layer7 is traced, at 442, to drawing layer L21 210 and drawing layer L18 (not shown). No additional related rules are identified, at 452, between drawing layers L21 210, L18 (not shown), L2 202, and L3 204. Derived layer Layer1 220 is also related to rule #6 that impacts derived layer Layer8 that includes drawing layer L2 202 and drawing layer L11 (not shown), at 444. Derived layer Layer8 then is traced to being related to rule #54 that impacts drawing layer L3 204 and drawing layer L11 (not shown).

Figure 5:
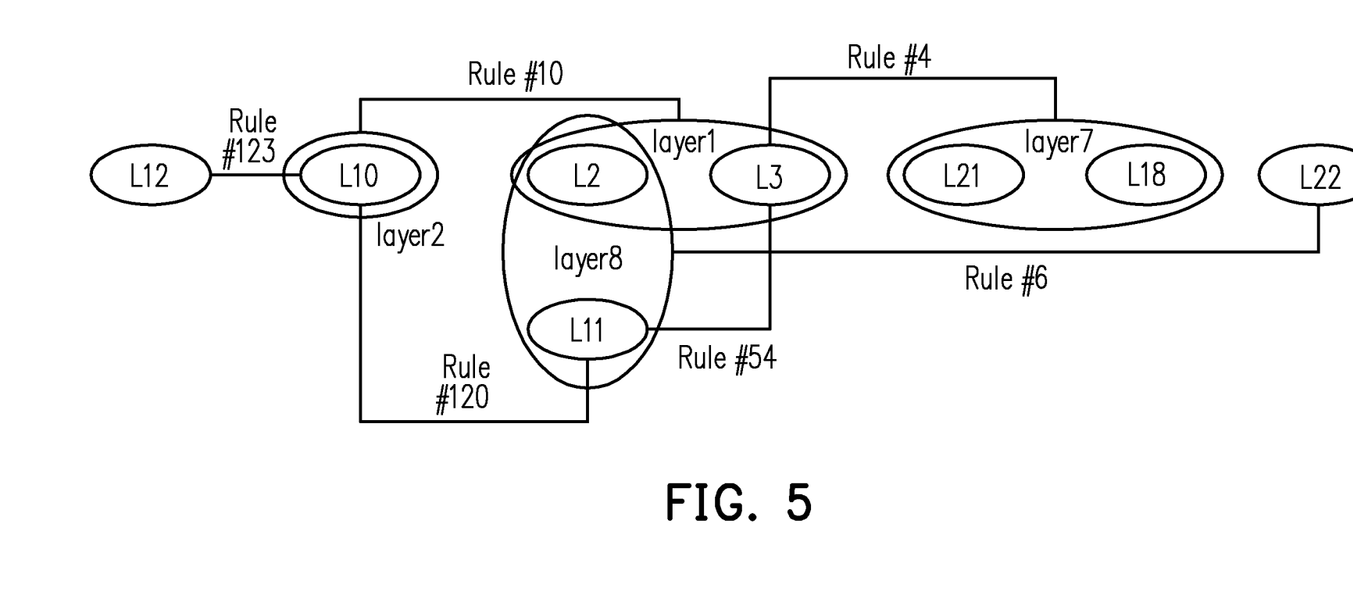
FIG. 5 illustrates an exemplary graph tree generated by a translator in accordance with various embodiments of the present disclosure.

The rule constraints identified in the extracted layer relation tree 400 are then converted using a translator to environmental layers of a graph tree. FIG. 5 illustrates an exemplary graph tree 500 generated by a translator in accordance with various embodiments of the present disclosure. Each layer is designated as a modifiable layer or a fastened layer based on this translation. The constraints of extracted layer relation tree 400 are applied to the fastened layers. The forbidden regions are created from the environmental layers based on the rules. The layers designated as modifiable can be moved to any region outside of the forbidden region that facilitates fixing the violation so long as the layer is not moved within the forbidden region. Derived layers are generated using graph tree 500. For example, derived layer Layer1 210 is generated having drawing layer L2 202 and drawing layer L3 204 based on the interplay between rule #10 and rule #4.

Figure 6A:
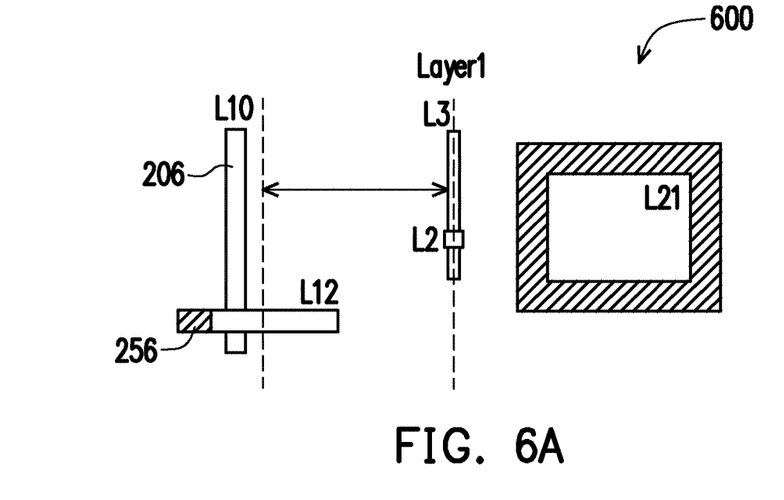
FIG. 6A illustrates an exemplary device layout having the rule violation of device layout of FIG. 2A fixed in accordance with various embodiments of the present disclosure.
Figure 6B:
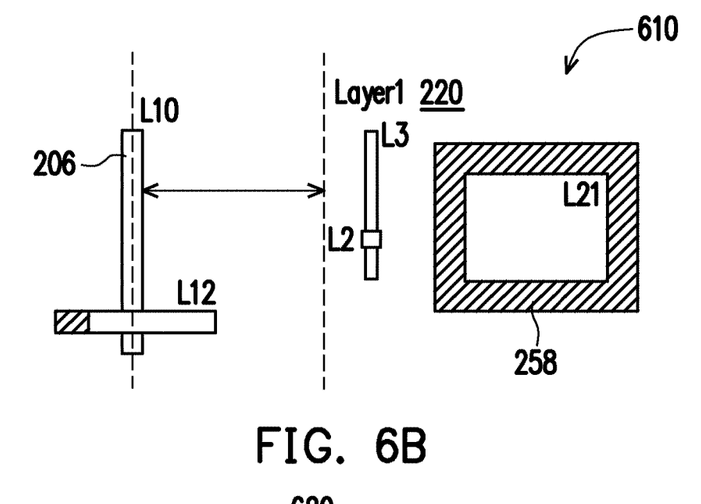
FIG. 6B illustrates another exemplary device layout having the rule violation of device layout of FIG. 2A fixed in accordance with various embodiments of the present disclosure.
Figure 6C:
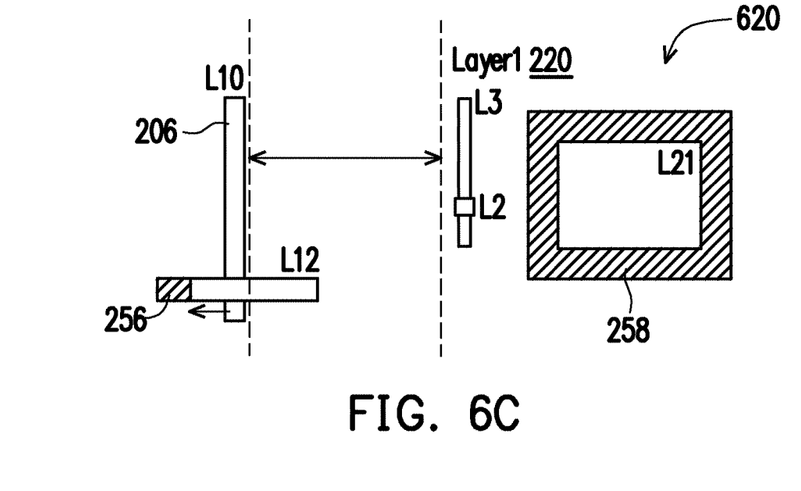
FIG. 6C illustrates yet another exemplary device layout having the rule violation of device layout of FIG. 2A fixed in accordance with various embodiments of the present disclosure.

FIG. 6A illustrates an exemplary device layout 600 having the rule violation of device layout 200 of FIG. 2A fixed in accordance with various embodiments of the present disclosure. In FIG. 6A, the violation is fixed by moving design layer L10 206 in a horizontal direction by a certain distance, without intruding within the forbidden region 256. FIG. 6B illustrates another exemplary device layout 610 having the rule violation of device layout 200 of FIG. 2A fixed in accordance with various embodiments of the present disclosure. The variation in FIG. 6B, fixes the violation by moving derived layer Layer1 220 in a horizontal direction by a certain distance, without intruding within the forbidden region 258. FIG. 6C illustrates yet another exemplary device layout 620 having the rule violation of device layout 200 of FIG. 2A fixed in accordance with various embodiments of the present disclosure. In FIG. 6C, the violation is fixed by moving both design layer L10 206 in a horizontal direction by a certain distance and by moving derived layer Layer1 220 in a horizontal direction by a certain distance, without intruding within either forbidden regions 256, 258. A layer entering into the forbidden region indicates that another rule violation has occurred.

Device layouts 600, 610, 620 can be layouts automatically proposed by the deterministic model to an end user. Alternatively, device layouts 600, 610, 620 can be layout automatically generated by the deterministic model. In each of device layouts 600, 610, 620 any moved layers no longer violate rule #10 or any other rule designated within the DRM or DRC deck. The certain distance in which any modifiable layer is moved can be determined by detecting how much distance is required to fix the rule violation. For example, if rule #10 requires a horizontal distance between drawing layer L10 206 and drawing layer L3 204 of approximately 0.05 um and the horizontal distance 212 is 0.04 um, then horizontal distance 212 needs to increase by 0.01 um to fix the rule violation. The drawings layers and/or derived layers can be moved accordingly so as to account for the violation as described in FIGS. 6A-6C. A priority of movement can be applied by moving layers that are part of the top layer of a device layout (e.g., the top layer has a higher priority).

Figure 7:
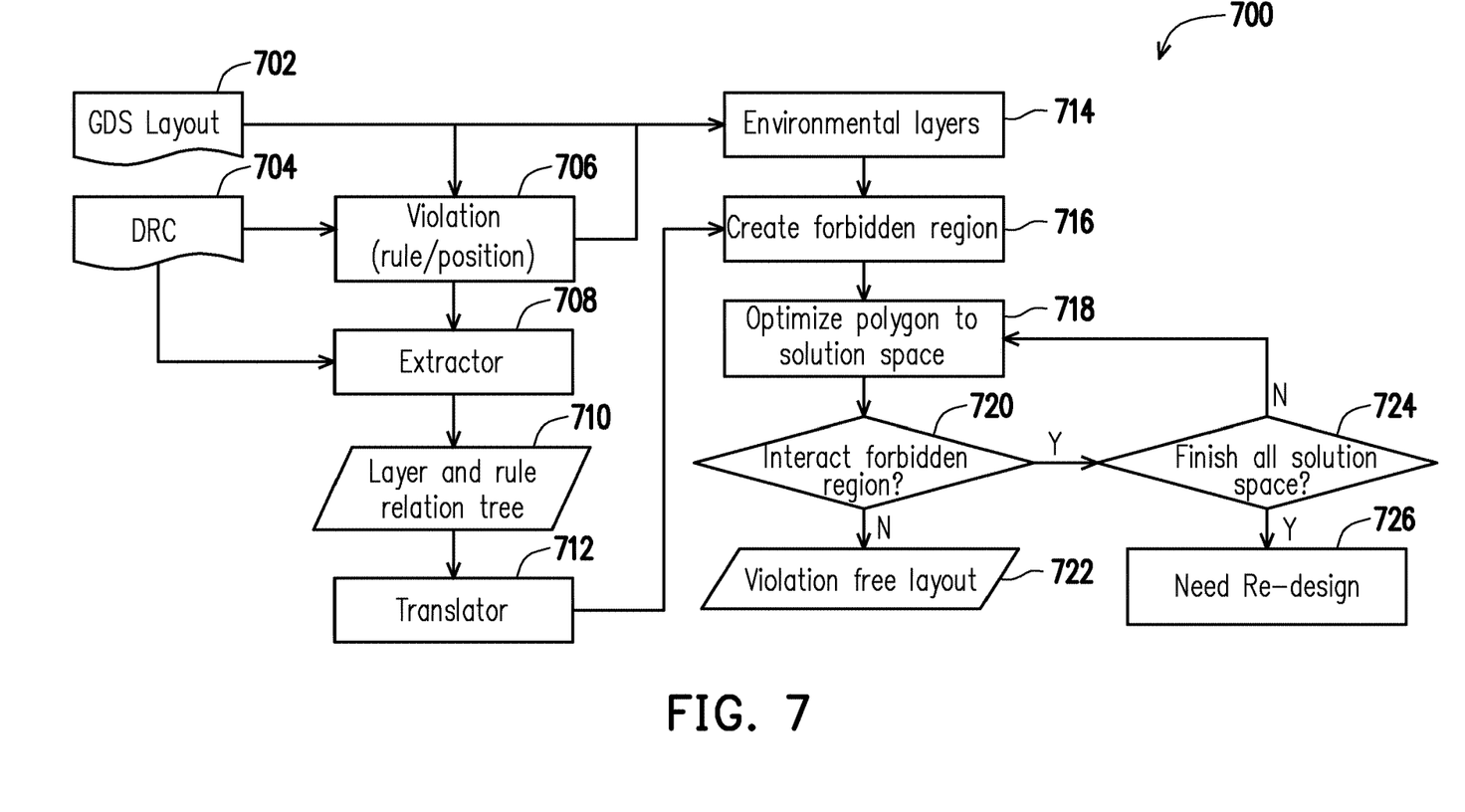
FIG. 7 illustrates an exemplary process flow diagram for fixing a rule violation in accordance with various embodiments of the present disclosure.

FIG. 7 illustrates an exemplary process flow diagram 700 for fixing a rule violation in accordance with various embodiments of the present disclosure. An original layout of a semiconductor device, such as a GDS layout 702, can be evaluated against design rules defined by a DRC deck 704. The original layout includes a number of layers (e.g., environmental layers 714). A violation of a rule is identified, at 706. An extractor 708 extracts a layer and rule relation tree 710 as described in detail in FIGS. 3-4. A translator 712 translates the layer and rule relation tree 710 into a graph tree as described in FIG. 5. Forbidden regions are created, at 716, based on the graph tree. Layers within the original design are optimized, at 718, by being moved in an optimal fashion to fix the violation. In some examples, the optimized positioning of layers may include moving the layers by the minimum amount of distance required to fix the violation while maintaining a close proximity to neighboring layers such that overall area of the layout is minimized to the greatest extent possible. Such optimization can include area optimization of the layers. For example, the arrangement of the layers within the new layout having no violations can consume an area, collectively, that is less than an area consumed by layers of the original layout. A check is performed to determine whether a layer interacts with a forbidden region, at 720. If a modifiable layer does interact with a forbidden region, the layout is evaluated, at 724, to determine whether there is additional solution space or distance that one or more of the layers can be moved to in order to ensure the layer is not interacting with the forbidden region. If the layers cannot be moved any further but still interacts with the forbidden region, the design layout is flagged for re-design, at 726. If, on the other hand, the layers do not interact with the forbidden region, then the design layout fixes the violation and is violation free at 722.

Figure 8:
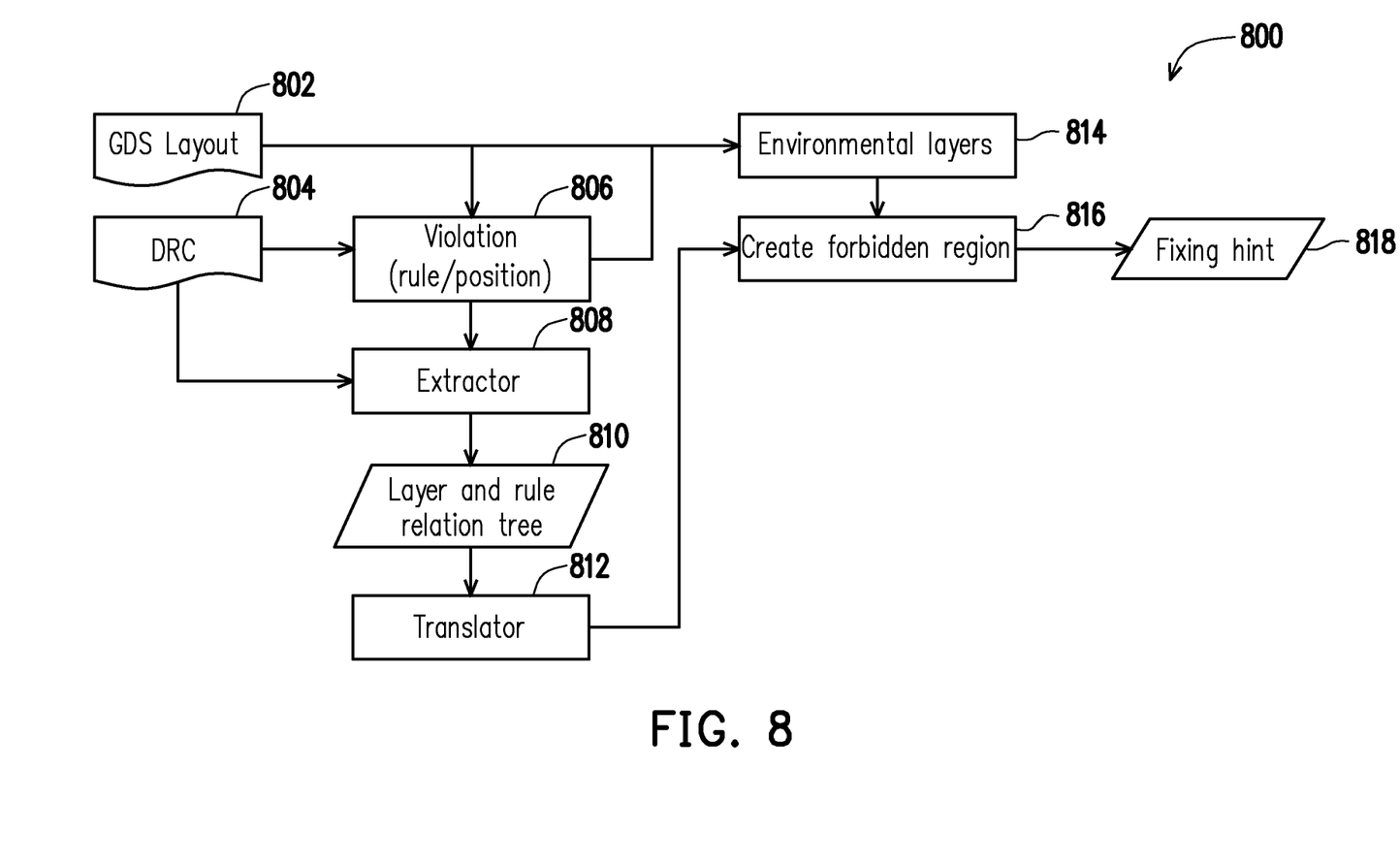
FIG. 8 illustrates an exemplary process flow diagram for proposing fixes of a rule violation in accordance with various embodiments of the present disclosure.

FIG. 8 illustrates an exemplary process flow diagram 800 for proposing fixes of a rule violation in accordance with various embodiments of the present disclosure. An original layout of a semiconductor device, such as a GDS layout 802, can be evaluated against design rules defined by a DRC deck 804. The original layout includes a number of layers (e.g., environmental layers 814). A violation of a rule is identified, at 806. An extractor 808 extracts a layer and rule relation tree 810 as described in detail in FIGS. 3-4. A translator 812 translates the layer and rule relation tree 810 into a graph tree as described in FIG. 5. Forbidden regions are created, at 816, based on the graph tree. In this variation, a proposed layout is generated identifying fixing hints 818 (e.g., fixing hints 254, 256) for modifying the orientation of the modifiable layers different from the original layout. The fixing hints ensure that layer within the proposed layout protrudes within the forbidden region. A user can manually modify the design layout in accordance with the provided fixing hints.

Figure 9:
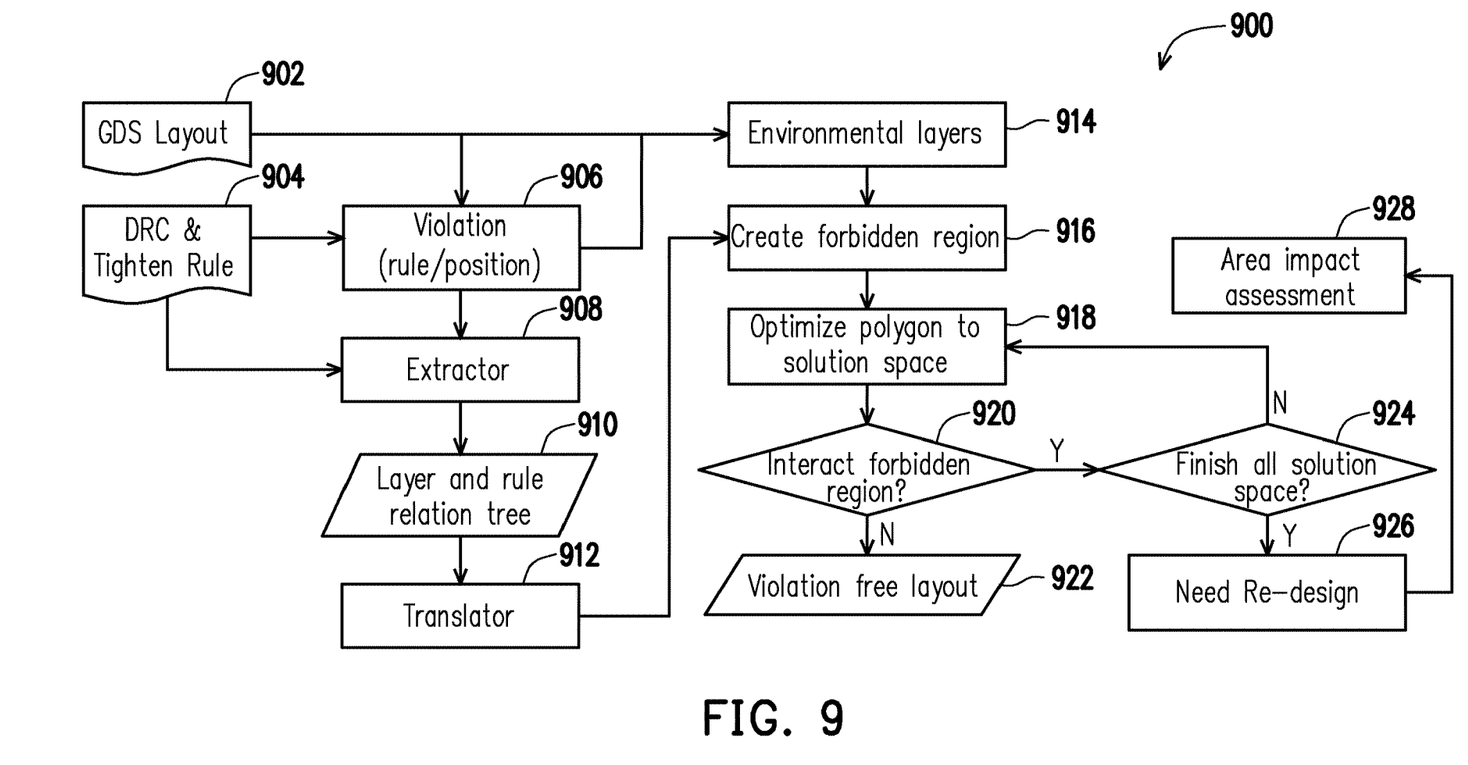
FIG. 9 illustrates an exemplary process flow diagram for fixing a rule violation in accordance with various embodiments of the present disclosure.

FIG. 9 illustrates an exemplary process flow diagram 900 for fixing a rule violation in accordance with various embodiments of the present disclosure. An original layout of a semiconductor device, such as a GDS layout 902, can be evaluated against design rules defined by a DRC deck 904 having tightened rules. The original layout includes a number of layers (e.g., environmental layers 914). A violation of a rule is identified, at 906. An extractor 908 extracts a layer and rule relation tree 910 as described in detail in FIGS. 3-4. A translator 912 translates the layer and rule relation tree 910 into a graph tree as described in FIG. 5. Forbidden regions are created, at 916, based on the graph tree. Layers within the original design are optimized, at 918, by being moved in an optimal fashion to fix the violation. In some examples, the optimized positioning of layers may include moving the layers by the minimum amount of distance required to fix the violation while maintaining a close proximity to neighboring layers such that overall area of the layout is minimized to the greatest extent possible. A check is performed to determine whether a layer interacts with a forbidden region, at 920. If a modifiable layer does interact with a forbidden region, the layout is evaluated, at 924, to determine whether there is additional solution space or distance that one or more of the layers can be moved to in order to ensure the layer is not interacting with the forbidden region. If the layers cannot be moved any further but still interacts with the forbidden region, the design layout is flagged for re-design, at 926. An area impact assessment 928 is performed to determine how much additional area is needed within the device layout to fix the violation. This can occur in cases where less than 100% of the violation is addressed. Rules of DRC 904 can be tightened accordingly based on the area impact assessment to further address the violation and the process can be re-run. If, on the other hand, the layers do not interact with the forbidden region, then the design layout fixes the violation and is violation free at 722.

Figure 10:
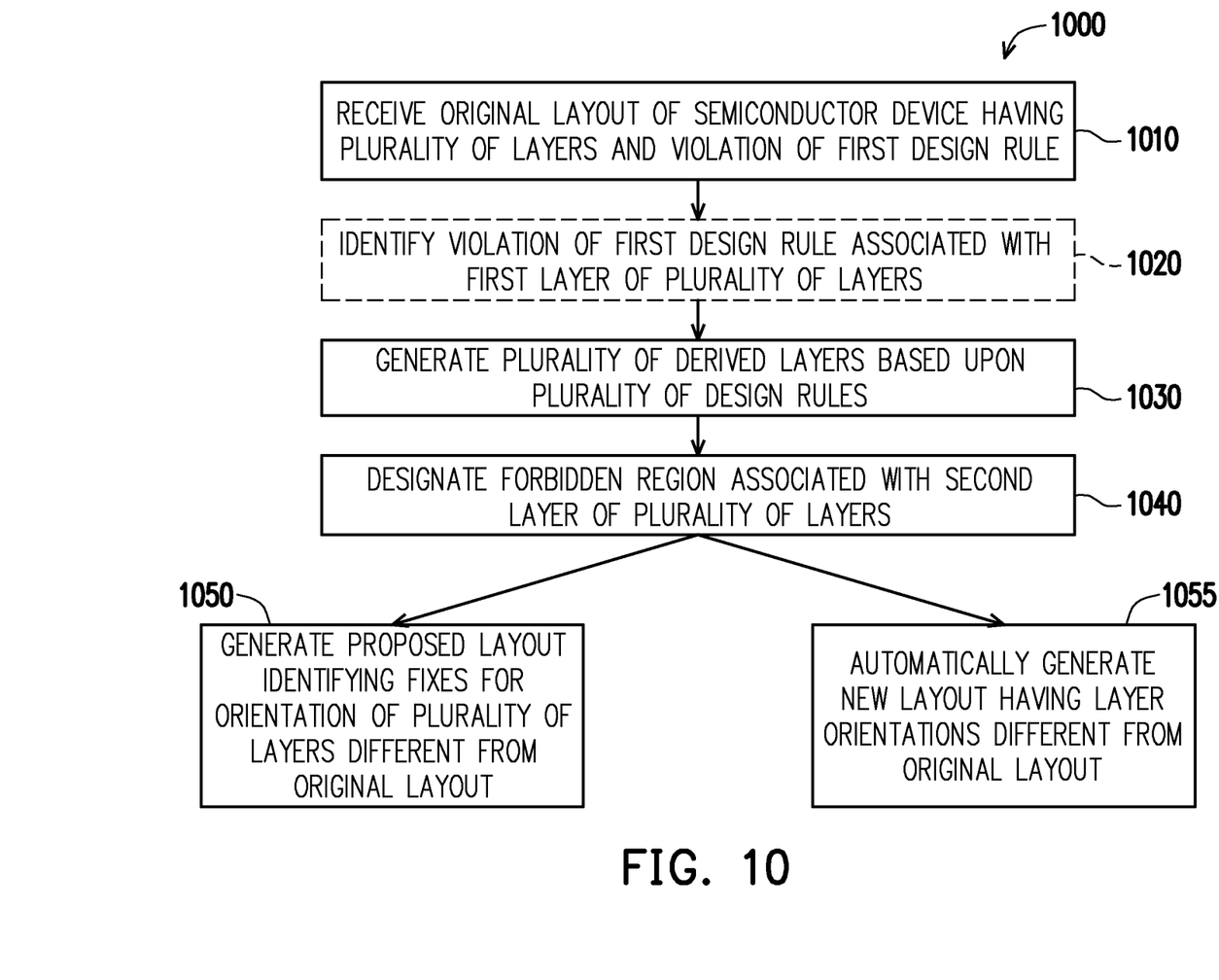
FIG. 10 illustrates a flow chart for an exemplary method of using a deterministic system for device layout optimization in accordance with various embodiments of the present disclosure.

FIG. 10 illustrates a flow chart 1000 for an exemplary method of using a deterministic system for device layout optimization in accordance with various embodiments of the present disclosure. An original layout of a semiconductor device is received, at 1010, which includes (i) a plurality of layers and (ii) a violation of a first design rule associated with a first layer of the plurality of layers. In some embodiments, the violation of the first design rule associated with the first design rule is identified, at 1020. A design rule compilation includes a plurality of design rules associated with each layer of the plurality of layers. A plurality of derived layers are generated, at 1020, based upon the plurality of design rules. Each derived layer includes one or more layers of the semiconductor device in which physical movement to one layer impacts another layer. A forbidden region associated with a second layer of the plurality of layers is designated, at 1030. The forbidden region defines an area in which physical movements of the plurality of layers cannot intrude. In some embodiments, a proposed layout identifying fixes for orientation of the plurality of layers different from the original layout is generated, at 1050, where no layer within the proposed layout protrudes within the forbidden region. In other embodiments, a new layout having layer orientations that are different from the original layout is automatically generated, at 1055. Within the new layout, (i) no layer within the proposed layout protrudes within the forbidden region and (ii) the plurality of layers collectively consume an area less than an area consumed by the layers in the original layout.

Figure 11:
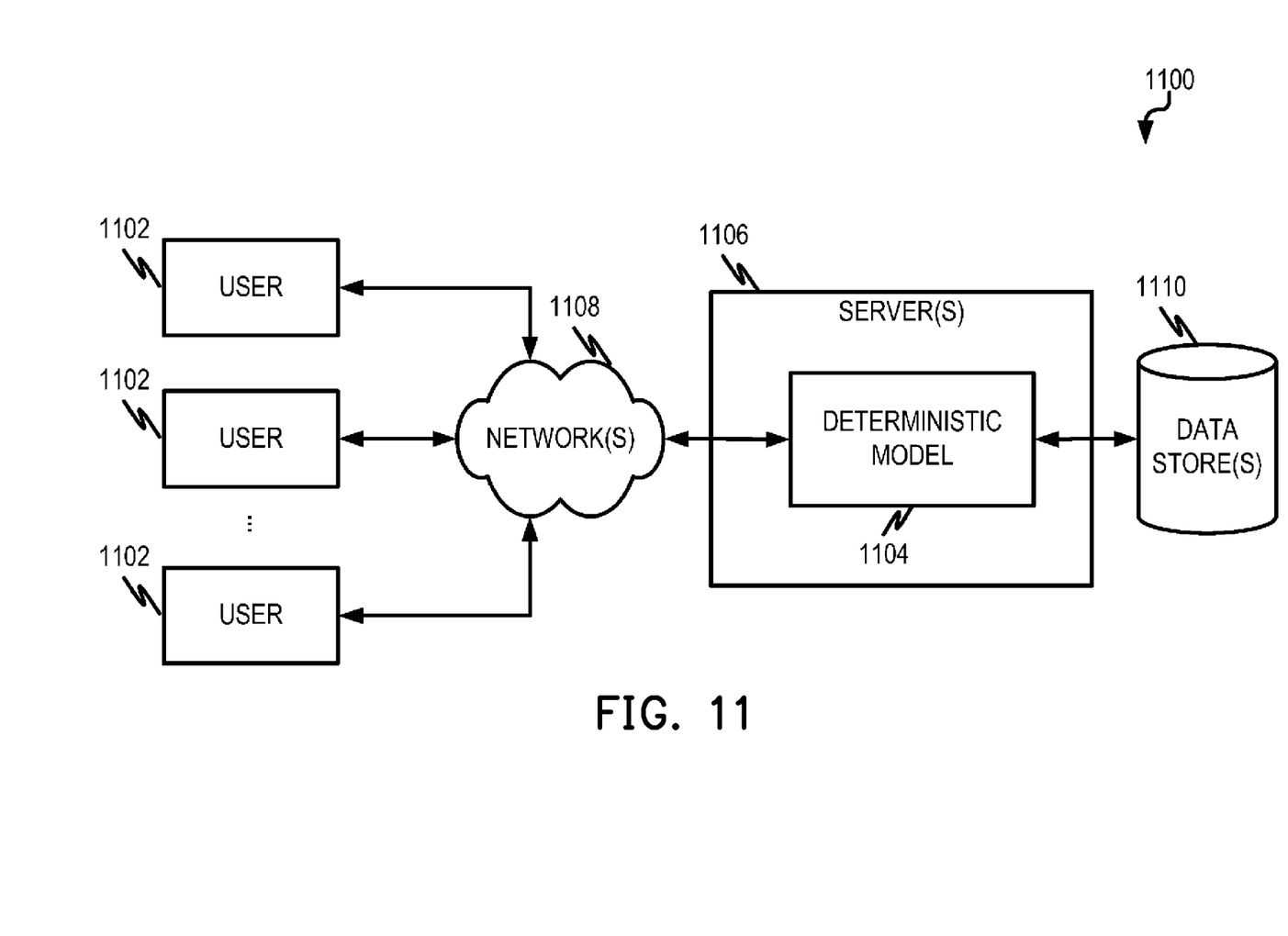
FIG. 11 illustrates an example computer-implemented environment for use in connection with the subject matter described herein in accordance with various embodiments of the present disclosure.

FIG. 11 illustrates an example computer-implemented environment 1100 wherein users 1102 can interact with deterministic model 1104 for fixing violations as described herein, hosted on one or more servers 1106 through a network 1108. As shown in FIG. 11, the users 1102 can interact with the deterministic model 1104 through a number of ways, such as over one or more networks 1108. One or more servers 1106 accessible through the network(s) 1108 can host the deterministic model 1104. The one or more servers 1106 can also contain or have access to one or more data stores 1110 for storing data for the deterministic model 1104.

Figure 12:
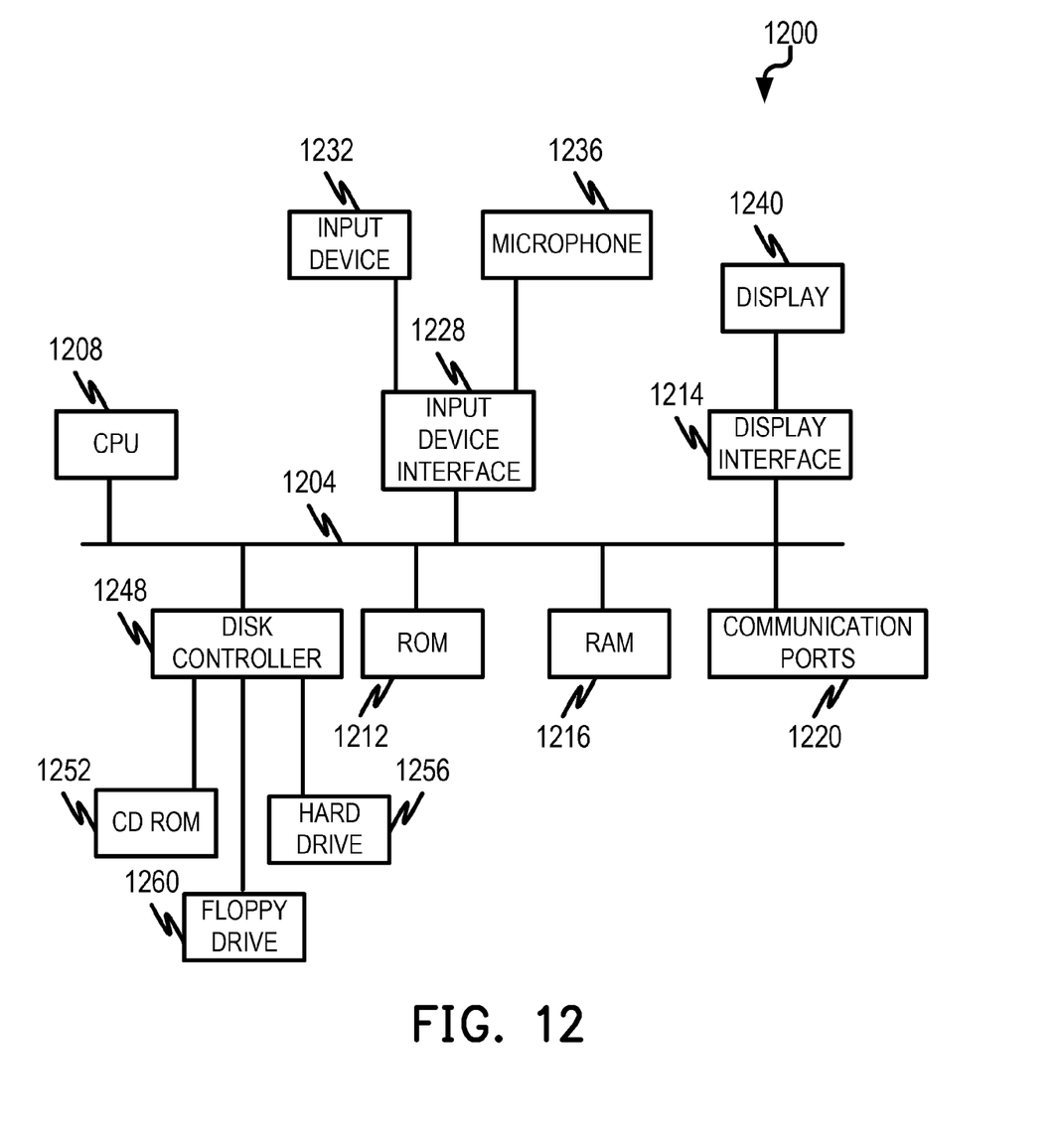
FIG. 12 is a diagram illustrating a sample computing device architecture for implementing various aspects described herein in accordance with various embodiments of the present disclosure.

FIG. 12 is a diagram 1200 illustrating a sample computing device architecture for implementing various aspects described herein. A bus 1204 can serve as the information highway interconnecting the other illustrated components of the hardware. A processing system 1208 labeled CPU (central processing unit) (e.g., one or more computer processors/data processors at a given computer or at multiple computers), can perform calculations and logic operations required to execute a program. A non-transitory processor-readable storage medium, such as read only memory (ROM) 1212 and random access memory (RAM) 1216, can be in communication with the processing system 1208 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 1248 can interface one or more optional disk drives to the system bus 1204. These disk drives can be external or internal floppy disk drives such as 1260, external or internal CD-ROM, CD-R, CD-RW or DVD, or solid state drives such as 1252, or external or internal hard drives 1256. As indicated previously, these various disk drives 1252, 1256, 1260 and disk controllers are optional devices. The system bus 1204 can also include at least one communication port 1220 to allow for communication with external devices either physically connected to the computing system or available externally through a wired or wireless network. In some cases, the communication port 1220 includes or otherwise comprises a network interface.

To provide for interaction with a user, the subject matter described herein can be implemented on a computing device having a display device 1240 (e.g., a CRT (cathode ray tube) or LCD (liquid crystal display) monitor) for displaying information obtained from the bus 1204 to the user and an input device 1232 such as keyboard and/or a pointing device (e.g., a mouse or a trackball) and/or a touchscreen by which the user can provide input to the computer. Other kinds of input devices 1232 can be used to provide for interaction with a user as well; for example, feedback provided to the user can be any form of sensory feedback (e.g., visual feedback, auditory feedback by way of a microphone 1236, or tactile feedback); and input from the user can be received in any form, including acoustic, speech, or tactile input. In the input device 1232 and the microphone 1236 can be coupled to and convey information via the bus 1204 by way of an input device interface 1228. Other computing devices, such as dedicated servers, can omit one or more of the display 1240 and display interface 1214, the input device 1232, the microphone 1236, and input device interface 1228.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C, C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

Use of the various circuits and configurations as described herein can provide a number of advantages. For example, by using the deterministic approach described herein, automatic fixing of rule violations induced by device layout designs without inducing new violations. The existing DRC deck can be relied upon to check device layout designs so as to avoid inducing error in translation of this DRC deck. Minimal to no violation check and/or design iterations are required when using the deterministic approach described herein. Any rule violations are addressed with as little as one iteration. Such an approach provides a systematic way for design impact assessments within strict design rule requirements. Additionally, the approach described herein In one embodiment, a method includes receiving an original layout of a semiconductor device includes a plurality of layers. A violation of a first design rule associated with a first layer of the plurality of layers is identified. A design rule compilation includes a plurality of design rules associated with each layer of the plurality of layers. A plurality of derived layers are generated based upon the plurality of design rules. Each derived layer includes one or more layers of the semiconductor device in which physical movement to one layer impacts another layer. A forbidden region associated with a second layer of the plurality of layers is designated. A proposed layout is generated identifying fixes for orientation of the plurality of layers different from the original layout. No layer within the proposed layout protrudes within the forbidden region.

In another embodiment, a system includes one or more data processors and memory storing instructions stored on one or more data processors which when executed result in operations including receiving a layout of a semiconductor device comprising a plurality of layers. The layout includes a violation of a first design rule associated with a first layer of the plurality of layers. A plurality of derived layers are generated based upon a plurality of design rules of a design rule compilation associated the plurality of layers. Each derived layer includes one or more layers of the semiconductor device in which physical movement to one layer impacts another layer. A forbidden region associated with a second layer of the plurality of layers is designated. A proposed layout identifying new orientations of some of the plurality of layers different from the layout is generated. No layer within the proposed layout protrudes within the forbidden region.

In yet another embodiment, a method includes receiving an original layout of a semiconductor device comprising a plurality of layers. A violation of a first design rule associated with a first layer of the plurality of layers is identified. A design rule compilation includes a plurality of design rules associated with each layer of the plurality of layers. A plurality of derived layers are generated based upon the plurality of design rules, wherein each derived layer comprises one or more layers of the semiconductor device in which physical movement to one layer impacts another layer. A forbidden region associated with a second layer of the plurality of layers is designated. A new layout is automatically generated identifying fixes for orientation of the plurality of layers different from the original layout, wherein (i) no layer within the proposed layout protrudes within the forbidden region and (ii) components of the new layout collectively consume an area less than an area consumed by the components in the original layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    receiving an original layout of a semiconductor device comprising a plurality of layers;
    identifying a violation of a first design rule associated with a first layer of the plurality of layers, wherein a design rule compilation comprises a plurality of design rules associated with each layer of the plurality of layers;
    generating a plurality of derived layers based upon the plurality of design rules, wherein each derived layer of the plurality of derived layers comprises one or more layers of the plurality of layers of the semiconductor device in which a physical movement to one layer impacts another layer;
    designating a forbidden region associated with a second layer of the plurality of layers; and generating a proposed layout identifying fixes for orientations of the plurality of layers different from the original layout, wherein no layer within the proposed layout protrudes within the forbidden region.

2. The method of claim 1, further comprising:
extracting a relation tree comprising the plurality of derived layers; and
designating each layer of the plurality of layers as either a fastened layer or a modifiable layer based on the relation tree, wherein the fastened layer remains physically unmodified within the proposed layout and the modifiable layer is subjected to modification within the proposed layout.

3. The method of claim 2, wherein each forbidden region surrounds or is adjacent to a corresponding fastened layer.

4. The method of claim 2, wherein the first layer is a modifiable layer.

5. The method of claim 1, further comprising generating a new layout based on the proposed layout, the new layout of the plurality of layers having oriented differently than the original layout, wherein no layer of the new layout protrudes within the forbidden region.

6. The method of claim 1, wherein the generating of the plurality of derived layers comprises:
identifying a second layer impacted by the first design rule, wherein a physical movement of the first layer to correct the violation causes another violation of a second design rule associated with the second layer; and
grouping together the first layer and the second layer into a first derived layer.

7. The method of claim 1, wherein the design rule compilation comprises at least one of a design rule manual or a design rule check program.

8. A system comprising:
one or more data processors;
memory storing instructions stored on one or more data processors which, when executed, result in performed operations comprising:
receiving a layout of a semiconductor device comprising a plurality of layers, wherein the layout comprises a violation of a first design rule associated with a first layer of the plurality of layers;
generating a plurality of derived layers based upon a plurality of design rules of a design rule compilation associated the plurality of layers, wherein each derived layer of the plurality of derived layers comprises one or more layers of the plurality of layers of the semiconductor device in which a physical movement to one layer impacts another layer;
designating a forbidden region associated with a second layer of the plurality of layers; and
generating a proposed layout identifying new orientations of some layers of the plurality of layers different from the layout, wherein no layer within the proposed layout protrudes within the forbidden region.

9. The system of claim 8, wherein the operations further comprise:
extracting a relation tree comprising the plurality of derived layers; and
designating each layer of the plurality of layers as either a fastened layer or a modifiable layer based on the relation tree, wherein the fastened layer remains physically unmodified within the proposed layout and the modifiable layer is subjected to modification within the proposed layout.

10. The system of claim 9, wherein each forbidden region surrounds or is adjacent to a corresponding fastened layer.

11. The system of claim 9, wherein the first layer is a modifiable layer.

12. The system of claim 8, wherein the operations further comprise generating a new layout based on the proposed layout, the new layout of the plurality of layers having oriented differently than the layout, wherein no layer of the new layout protrudes within the forbidden region.

13. The method of system 8, wherein the generating of the plurality of derived layers comprises:
identifying a second layer impacted by the first design rule, wherein a physical movement of the first layer to correct the violation causes another violation of a second design rule associated with the second layer; and
grouping together the first layer and the second layer into a first derived layer.

14. The system of claim 8, wherein the design rule compilation comprises at least one of a design rule manual or a design rule check program.

15. A method comprising:
receiving an original layout of a semiconductor device comprising (i) a plurality of layers and (ii) a violation of a first design rule associated with a first layer of the plurality of layers, wherein a design rule compilation comprises a plurality of design rules associated with each layer of the plurality of layers;
generating a plurality of derived layers based upon the plurality of design rules, wherein each derived layer of the plurality of derived layers comprises one or more layers of the plurality of layers of the semiconductor device in which a physical movement to one layer impacts another layer;
designating a forbidden region associated with a second layer of the plurality of layers, the forbidden region defining an area in which physical movements of the plurality of layers cannot intrude; and
automatically generating a new layout having layer orientations that are different from the original layout, wherein (i) no layer within a proposed layout protrudes within the forbidden region and (ii) layers of the new layout collectively consume an area less than an area consumed by the layers in the original layout.

16. The method of claim 15, further comprising:
extracting a relation tree comprising the plurality of derived layers; and
designating each layer of the plurality of layers as either a fastened layer or a modifiable layer based on the relation tree, wherein the fastened layer remains physically unmodified within the proposed layout and the modifiable layer is subjected to modification within the proposed layout.

17. The method of claim 16, wherein each forbidden region surrounds or is adjacent to a corresponding fastened layer.

18. The method of claim 16, wherein the first layer is a modifiable layer.

19. The method of claim 16, wherein the design rule compilation comprises at least one of a design rule manual or a design rule check program.

20. The method of claim 15, wherein the generating of the plurality of derived layers comprises:
identifying a second layer impacted by the first design rule, wherein a physical movement of the first layer to correct the violation causes another violation of a second design rule associated with the second layer; and grouping together the first layer and the second layer into a first derived layer.

\* \* \* \* \*